United States Patent [19]

Miyamoto et al.

[11] Patent Number: 4,803,663
[45] Date of Patent: Feb. 7, 1989

[54] SEMICONDUCTOR MEMORY HAVING DIVIDED BIT LINES AND INDIVIDUAL SENSE AMPLIFIERS

[75] Inventors: Hiroshi Miyamoto; Michihiro Yamada, both of Hyogo, Japan

[73] Assignee: Mitsubishi Denki Kabushiki Kaisha, Tokyo, Japan

[21] Appl. No.: 27,536

[22] Filed: Mar. 18, 1987

[30] Foreign Application Priority Data

Mar. 18, 1986 [JP] Japan .................. 61-62052

[51] Int. Cl.⁴ ............... G11C 7/00; G11C 11/40; H03K 5/24
[52] U.S. Cl. .................. 365/189; 365/205; 365/206; 365/207; 365/194
[58] Field of Search ............... 365/205, 206, 207, 190, 365/189, 194

[56] References Cited

U.S. PATENT DOCUMENTS

| 4,255,678 | 3/1981 | Suzuki et al. | 365/190 X |
| 4,451,906 | 5/1984 | Ikeda | 365/190 X |
| 4,545,037 | 10/1985 | Nakano | 365/207 X |

FOREIGN PATENT DOCUMENTS 101093 6/1984 Japan .
57-159 12/1985 Japan .

OTHER PUBLICATIONS

Digest of Technical Papers, ISSCC 84, "A Sub 100ns 256K DRAM in CMOS III Technology", by R. I. Kung et al., pp. 278-279.

Primary Examiner—Stuart N. Hecker
Assistant Examiner—Alyssa H. Bowler
Attorney, Agent, or Firm—Lowe, Price, LeBlanc, Becker & Shur

[57] ABSTRACT

A dynamic RAM having a plurality of pairs of folded bit lines each divided into a plurality of pairs of divided bit lines comprises transfer gates (QT1, QT2) provided for each pair of divided bit lines for connecting/disconnecting the pair of adjacent divided bit lines to each other, sense amplifiers (SA1, SA2) provided for each of the pairs of divided bit lines for detecting and amplifying potential difference between the pairs of divided bit lines, restore circuits (RE1, RE2) provided for each of the pairs of divided bit lines for boosting the potential on the bit line on the side of a high potential of the pairs of the divided bit lines, and a control circuit (TG) for turning the transfer gates (QT1, QT2) on after a predetermined time since the sense amplifier was operated in response to a sense amplifier activating signal.

10 Claims, 8 Drawing Sheets

SEMICONDUCTOR MEMORY HAVING DIVIDED BIT LINES AND INDIVIDUAL SENSE AMPLIFIERS

BACKGROUND OF THE INVENTION

1. Field of the Invention

The present invention relates to a large scale integrated semiconductor memory, and more particularly, it relates to a dynamic random access memory (referred to as a dynamic RAM hereinafter) formed by CMOS process.

2. Description of the Prior Art

A dynamic RAM generally employs a memory cell comprising a single transistor and a single capacitor. In this case, the smaller the ratio of capacitance of a bit line to capacitance of a capacitor in a memory cell is, the larger amount of change in potential on a bit line at the time of read-out is, and correspondingly the larger input potential difference for a sense amplifier is, so that read-out operation of information is ensured. However, as memory capacity is largely increased and integration thereof increases, the size of a memory cell becomes smaller, so that capacitance of a memory cell is reduced. On the other hand, since the number of memory cells connected to a single bit line increases, a bit line becomes longer, so that capacitance of a bit line tends to increase. As a result, the ratio of capacitance of a bit line to capacitance of a memory cell increases, so that read-out operation of information may not be ensured. To solve this problem, a single bit line is divided into a plurality of blocks so that the ratio of capacitance of a memory cell and a capacitance of a bit line may be reduced.

FIG. 1 is a circuit diagram showing a structure of a part of a conventional dynamic RAM, which is disclosed in, for example, an article by R. I. Kung et al., entitled "A Sub 100 ns 256 K DRAM in CMOS III Technology", Digest of Technical Papers, ISSCC 84, pp. 278-279. The structure of this circuit is now described. In FIG. 1, a so-called shared sense amplifier structure is shown wherein a bit line is divided into two parts and a sense amplifier is shared with the divided bit lines on both sides. In the above described document, a transistor in a memory cell comprises a p channel MOS transistor, a sense amplifier comprises a p channel MOS transistor, and a restore circuit comprises an n channel MOS transistor. For simplicity of illustration, these transistors have a conductivity type opposite to the above described conductivity type, in FIG. 1. In addition, the structure of the circuit is slightly simplified, so that only a pair of folded bit lines out of a plurality of pairs of folded bit lines is shown.

A pair of folded bit lines are divided into divided bit lines BL1, BLN, BL2, $\overline{BL1}$, $\overline{BLN}$ and $\overline{BL2}$. The divided bit lines BLN and $\overline{BLN}$ are paired and connected to a sense amplifier SA for discharging the bit line at a low potential to a ground potential. The divided bit lines BL1 and $\overline{BL1}$ are paired and connected to a restore circuit RE1 for charging the bit line at a high potential to a power supply potential. The divided bit lines BL2 and $\overline{BL2}$ are paired and connected to a restore circuit RE2 for charging the bit line at a high potential to the power supply potential.

The sense amplifier SA comprises an n channel MOS transistor QN1 having a drain connected to the divided bit line BLN, a gate connected to the divided bit line $\overline{BLN}$ and a source connected to one conduction terminal of a sense amplifier driver transistor QN5, and an n channel MOS transistor QN2 having a drain connected to the divided bit line $\overline{BLN}$, a gate connected to the divided bit line BLN and a source connected to one conduction terminal of the sense amplifier driver transistor QN5. The sense amplifier driver transistor QN5 is turned on in response to a sense amplifier activating signal applied to the gate thereof, so that a ground potential $V_{SS}$ is transferred to the sources of the transistors QN1 and QN2.

The restore circuit RE1 comprises a p channel MOS transistor QP1 having a drain connected to the divided bit line BL1, a gate connected to the divided bit line $\overline{BL1}$ and a source connected to one conduction terminal of a restore circuit driver transistor QP5, and a p channel MOS transistor QP2 having a drain connected to the divided bit line $\overline{BL1}$, a gate connected to the divided bit line BL1 and a source connected to one conduction terminal of the restore circuit driver transistor QP5. The restore circuit driver transistor QP5 is turned on in response to a restore circuit activating signal SP1 applied to the gate thereof, so that a power supply potential $V_{CC}$ is transferred to the sources of the transistors QP1 and QP2.

The restore circuit RE2 comprises a p channel MOS transistor QP3 having a drain connected to the divided bit line BL2, a gate connected to the divided bit line $\overline{BL2}$ and a source connected to one conduction terminal of a restore circuit driver transistor QP6, and a p channel MOS transistor QP4 having a drain connected to the divided bit line $\overline{BL2}$, a gate connected to the divided bit line BL2 and a source connected to one conduction terminal of the restore circuit driver transistor QP6. The restore circuit driver transistor QP6 is turned on in response to a restore circuit activating signal SP2, so that the power supply potential $V_{CC}$ is transferred to the sources of the transistors QP3 and QP4.

The divided bit lines BL1 and BLN are connected to each other through a transfer gate QT1 formed of an n channel MOS transistor, and the divided bit lines $\overline{BL1}$ and $\overline{BLN}$ are connected to each other through a transfer gate QT2 formed of an n channel MOS transistor. The transfer gates QT1 and QT2 are turned on in response to a transfer signal T1.

The divided bit lines BLN and BL2 are connected to each other through a transfer gate QT3 formed of an n channel MOS transistor. The divided bit lines $\overline{BLN}$ and $\overline{BL2}$ are connected to each other through a transfer gate QT4 formed of an n channel MOS transistor. The transfer gates QT3 and QT4 are turned on in response to a transfer signal T2.

The divided bit line BL1 and a bus line BU for transferring data are connected to each other through a column gate transistor QY1 formed of an n channel MOS transistor. The divided bit line $\overline{BL1}$ and a bus line $\overline{BU}$ for transferring data are connected to each other through a column gate transistor QY2 formed of an n channel MOS transistor. The column gate transistors QY1 and QY2 are turned on in response to a column selecting signal Y.

Although memory cells, the number of which depends on a memory capacity, are connected to each of the divided bit lines, only a memory cell MC1 connected to the divided bit line BL2 is typically shown. The memory cell MC1 comprises an n channel MOS transistor QS and a capacitor CS. The transistor QS has a gate being a part of a word line WL1 and a source connected to the divided bit line BL2. The capacitor CS has one electrode connected to the drain of the transistor QS and other electrode connected to a memory cell plate potential $V_{SG}$.

FIG. 2 is a waveform diagram for explaining operation at the time of read-out of information stored in the memory shown in FIG. 1. Referring now to FIG. 2 which is a waveform diagram explaining operation of the circuit shown in FIG. 1, how information is read out is described when the capacitor CS in the memory cell MC1 is not charged, that is, when information "0" is stored.

At the time $t_0$, the transfer signal T1 becomes an "L" level. Accordingly, the divided bit lines BLN and BL1 are isolated from each other and the divided bit lines $\overline{BLN}$ and $\overline{BL1}$ are isolated from each other. By that time, the divided bit lines BL1, $\overline{BL1}$, BL2, $\overline{BL2}$, BLN and $\overline{BLN}$ have been precharged at an intermediate potential level $(V_{CC}-V_{SS})/2$, where $V_{CC}$ is a power supply potential and $V_{SS}$ is a ground potential.

At the time $t_1$, the potential on the selected word line WL1 becomes an "H" level. Accordingly, MOS transistor QS is turned on. As a result, the potential on the divided bit line $\overline{BL2}$ slightly falls, so that potential difference occurs between the divided bit lines BL2 and $\overline{BL2}$.

At the time $t_2$, a sense amplifier activating signal SN becomes an "H" level. As a result, potential difference is increased between the divided bit lines BL2 and BL2. More specifically, the potential on the divided bit line BL2 is held near the above described intermediate potential, while the divided bit line BL2 is discharged through the transfer gate transistor QT3 and the sense amplifier SA, so that the potential thereon becomes near the ground potential $V_{SS}$.

At the time $t_3$, the restore circuit activating signal SP2 becomes an "L" level. As a result, the potential on the divided bit line $\overline{BL2}$ is pulled up near the power supply potential $V_{CC}$ by the restore circuit RE2, so that potential difference is further increased between the divided bit lines BL2 and $\overline{BL2}$.

At the time $t_4$, the transfer signal T1 becomes again an "H" level. Thus, the potential on the divided bit lines BLN and $\overline{BLN}$ are transferred to the divided bit lines BL1 and $\overline{BL1}$. As a result, the divided bit line BL1 is discharged, so that the potential thereon becomes near the ground potential $V_{SS}$, while the potential on the divided bit line is pulled up.

At the time $t_5$, the restore circuit activating signal SP1 becomes an "L" level. As a result, the potential on the divided bit line $\overline{BL1}$ is pulled up near the power supply potential $V_{CC}$.

At the time $t_6$, the column selecting signal Y becomes an "H" level. Thus, the potential on the divided bit lines BL1 and $\overline{BL1}$ are transferred to the bus lines BU and $\overline{BU}$, so that information "0" stored in the memory cell MC1 is read out.

In the circuit shown in FIG. 1, information stored in the capacitor CS in the memory cell MC1 is read out to the divided bit line BL2, so that potential difference between the divided bit lines BL2 and $\overline{BL2}$ is amplified by the sense amplifier SA. At that time, the divided bit line BL2 is discharged at the sense amplifier SA through a transfer gate transistor QT3. In a dynamic RAM with a folded bit line structure, a bit line is generally formed of a low resistive material such as aluminum or refractory metal silicide. Therefore, resistance of a bit line can be reduced, so that discharge of charges on the bit line can be accelerated. However, in a dynamic RAM with a shared sense amplifier structure, a transfer gate transistor is provided between a divided bit line connected to a memory cell and a sense amplifier, so that a bit line can not be formed of a low resistive material in this transfer gate transistor portion. In addition, as shown in FIG. 1, since the transfer gate transistor must be provided for each pitch between bit lines, the transistor width can be made almost the same as or at most twice the pitch between bit lines. Since the pitch between the bit lines is, for example, about 3 μm in a 1 Mega-bit dynamic RAM, the transistor width of the transfer gate transistor is limited to less than several μm. As a result, conductance of the transfer gate transistor is reduced, so that discharge of charges on the divided bit line is delayed when the sense amplifier operates. Furthermore, since a source and a drain of the transfer gate transistor are formed of a diffusion layer provided in a substrate or a well, noise is transferred to a bit line through the substrate or the well, so that the sense amplifier erroneously operates.

FIG. 3 is a circuit diagram showing a part of a structure of another conventional dynamic RAM, which is disclosed in the Japanese Laying-Open Gazette No. 101093/1984. The structure of this circuit is now described. In FIG. 3, the circuit comprises only n channel MOS transistors. For simplicity of illustration, only a pair of folded bit lines out of a plurality of pairs of folded bit lines, are shown herein.

The pair of folded bit lines are divided into three pairs of divided bit lines BL4 and $\overline{BL4}$, BL5 and $\overline{BL5}$ and BL6 and $\overline{BL6}$. The pair of divided bit lines BL4 and $\overline{BL4}$ are connected to an active pull-up circuit AP which is activated in response to an active pull-up signal APE for boosting the potential on the bit line at a high potential to the power supply potential, and a bit line precharge circuit BC for precharging the potential on the bit line to the intermediate potential.

The pair of divided bit lines BL5 and $\overline{BL5}$ are connected to a sense amplifier SA5 which is activated in response to a sense amplifier driver signal for further increasing potential difference between the pair of divided bit lines.

The pair of divided bit lines BL6 and $\overline{BL6}$ are connected to a sense amplifier SA6 which is activated in response to the sense amplifier driver signal for further increasing potential difference between the pair of divided bit lines.

The divided bit lines BL4 and BL5 are connected to each other through the transfer gate transistor QT1, while the divided bit lines $\overline{BL4}$ and $\overline{BL5}$ and are connected to each other through the transfer gate transistor QT2. The transfer gate transistors QT1 and QT2 are turned on in response to a transfer signal BSC.

The divided bit lines BL5 and BL6 are connected to each other through the transfer gate transistor QT3, while the divided bit lines $\overline{BL5}$ and $\overline{BL6}$ are connected to each other through the transfer gate QT4. The transfer gates QT3 and QT4 are turned on in response to the transfer signal BSC.

The divided bit line BL4 and the bus line BU for transferring data are connected to each other through the column gate transistor QY1, while the divided bit line $\overline{BL}$ and the bus line $\overline{BU}$ for transferring data are connected to each other through the column gate transistor QY2. The column gate transistors QY1 and QY2 are turned on in response to a column selecting signal.

Although memory cells, the number of which depends on a memory capacity, are connected to the divided bit lines BL5, $\overline{BL5}$, BL6 and $\overline{BL6}$ only a memory cell MC1 connected to the divided bit line BL5 is typically shown. The memory cell MC1 comprises the transfer transistor QS and the capacitor CS. The transistor QS has a gate being a part of the word line WL1. The capacitor CS has one electrode connected to the memory cell plate potential $V_{SG}$.

FIG. 4 is a waveform diagram explaining operation at the time of read-out of information stored in the circuit shown in FIG. 3.

Referring now to FIG. 4 which is a waveform diagram explaining operation of the circuit shown in FIG. 3, how information is read out is described when the capacitor CS in the memory cell MC1 is not charged, that is, when information "0" is stored.

Before the time $t_0$, the transfer signal BSC and a reset signal RST become an "H" level. Accordingly, all the transfer gate transistors QT1 to QT4 are turned on. Thus, the divided bit lines BL4, BL5 and BL6 are connected to each other, while the divided bit lines $\overline{BL4}$, $\overline{BL5}$ and $\overline{BL6}$ are connected to each other. In addition, since the reset signal RST becomes an "H" level, the bit line precharge circuit BC operates, so that each of the divided bit lines is precharged, so that the potential thereon becomes the intermediate potential $(V_{CC}-V_{SS})/2$.

At the time $t_1$, both the transfer signal BSC and the reset signal RST become an "L" level, and the selected word line WL1 becomes an "H" level. As a result, the potential on the divided bit line BL5 slightly falls, so that potential difference occurs between the divided bit lines BL5 and $\overline{BL5}$.

At the time $t_2$, a sense amplifier activating signal SN5 becomes an "H" level. Accordingly, the sense amplifier SA5 is activated. As a result, potential difference is increased between the divided bit lines BL5 and $\overline{BL5}$.

At the time $t_3$, the transfer signal BSC becomes an "H" level. Accordingly, the transfer gate transistors QT1 to QT4 are turned on. As a result, the potentials on the divided bit lines BL5 and $\overline{BL5}$ are transferred to the divided bit lines BL4 and BL6 and $\overline{BL4}$ and $\overline{BL6}$, respectively.

At the time $t_4$, a sense amplifier activating signal SN6 becomes an "H" level. As a result, potential difference is increased between the divided bit lines BL6 and $\overline{BL6}$, so that potential difference is increased between the divided bit lines BL4 and $\overline{BL4}$ and between the divided bit lines BL5 and $\overline{BL5}$.

At the time $t_5$, the active pull-up signal APE becomes an "H" level. Accordingly, the active pull-up circuit AP operates. As a result, the potential on the divided bit lines $\overline{BL4}$, $\overline{BL5}$ and $\overline{BL6}$ is pulled up near the power supply potential $V_{CC}$. Then, the column selecting signal Y becomes an "H" level. Thus, the potential on the divided bit lines BL4 and $\overline{BL4}$ are transferred to the bus lines BU and $\overline{BU}$, so that information "0" stored in the memory cell MC1 is read out.

In the circuit shown in FIG. 3, a sense amplifier is provided for each pair of divided bit lines, while an active pull-up circuit is provided not for each pair of divided bit lines but for each pair of folded bit lines. Therefore, since the potential on an entire bit line of each pair of folded bit lines must be pulled up by a single active pull-up circuit when the active pull-up circuit operates, the active pull-up circuit having large drive capacity is required, and the area of the circuit increases. Additionally, in order to pull up the potential on each of the divided bit lines to the power supply potential $V_{CC}$ by the active pull-up circuit, the gate potential of a transfer gate transistor, that is, the transfer signal BSC must be boosted over the power supply potential $V_{CC}$. However, integration of a memory increases, a gate oxide film of the transfer gate transistor tends to be thinner. For example, the gate oxide film in a 1 Mega-bit dynamic RAM is approximately 200 to 300 Å in thickness. Therefore, if the gate potential is boosted over the power supply potential $V_{cc}$, reliability of the gate oxide film is deteriorated. The other prior art showing the above described memory with a folded bit line structure, in which a bit line is divided, each pair of the divided bit lines being provided with a sense amplifier is disclosed in Japanese Patent Publication Gazette No. 57159/1985, by P. V. Basse, entitled "MOS Semiconductor Memory". This document corresponds to DEP No. 2647394.9 of West Germany application.

SUMMARY OF THE INVENTION

An object of the present invention is to remove the above described disadvantages of the conventional memory and to provide a semiconductor memory in which information is read out in a fast and stable manner, and a reliable gate oxide film is formed.

A semiconductor memory according to the present invention in which each pair of folded bit lines are divided into a plurality of divided bit lines comprises switching means for connecting/disconnecting adjacent divided bit lines, a sense amplifier and a restore circuit provided for each pair of divided bit lines, and control means responsive to an activating signal of the sense amplifier connected to the pair of divided bit lines including a selected memory cell for turning the switching means on.

According to the present invention, since a memory cell is directly connected to the sense amplifier without through a transfer gate transistor in each pair of divided bit lines, the bit line can be formed of only a low resistive material, and decrease in conductance of the transfer gate transistor, caused by narrowing the transistor width can be avoided even if high integration is provided. As a result, the bit line is discharged through the sense amplifier without through the transfer gate transistor at the time of serving operation, so that discharge of charges on the bit line and read-out of information from the memory cell are accelerated.

In addition, when information stored in a memory cell in a certain pair of divided bit lines is read out, the switching means is turned on by control means after potential difference between bit lines is sufficiently increased by the sense amplifier and the restore circuit, and then the potential difference is transferred to adjacent pairs of divided bit lines, so that sense operation is stabilized and operating margin of the semiconductor memory is increased.

Furthermore, since a restore circuit is provided for each pair of divided bit lines so that the potential on the bit line at a high potential may be pulled up, a conventional active pull-up circuit having large area is required.

Additionally, since the potential on the bit line is pulled up by the restore circuit for each pair of divided bit lines, the switching means need not be boosted over the power supply potential $V_{CC}$ for driving, so that reliability of the switching means is ensured. In addition, the switching means need not be boosted over the power supply potential V$_{CC}$, so that operation for reading out information is accelerated.

These objects and other objects, features, aspects and advantages of the present invention will become more apparent from the following detailed description of the present invention when taken in conjunction with the accompanying drawings.

DESCRIPTION THE PREFERRED EMBODIMENTS

Figure 1:
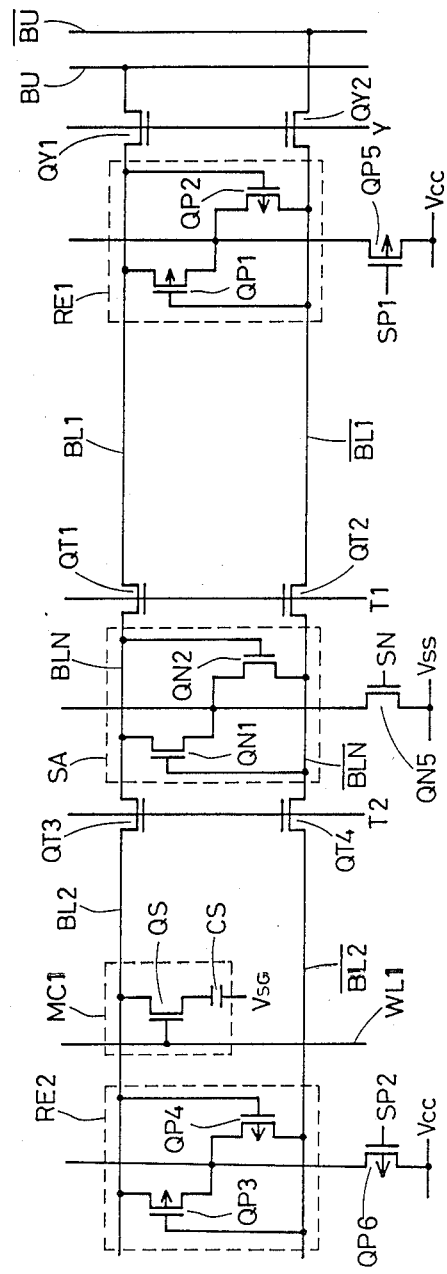
FIG. 1 is a diagram showing a part of a structure of a conventional dynamic RAM.
Figure 2:
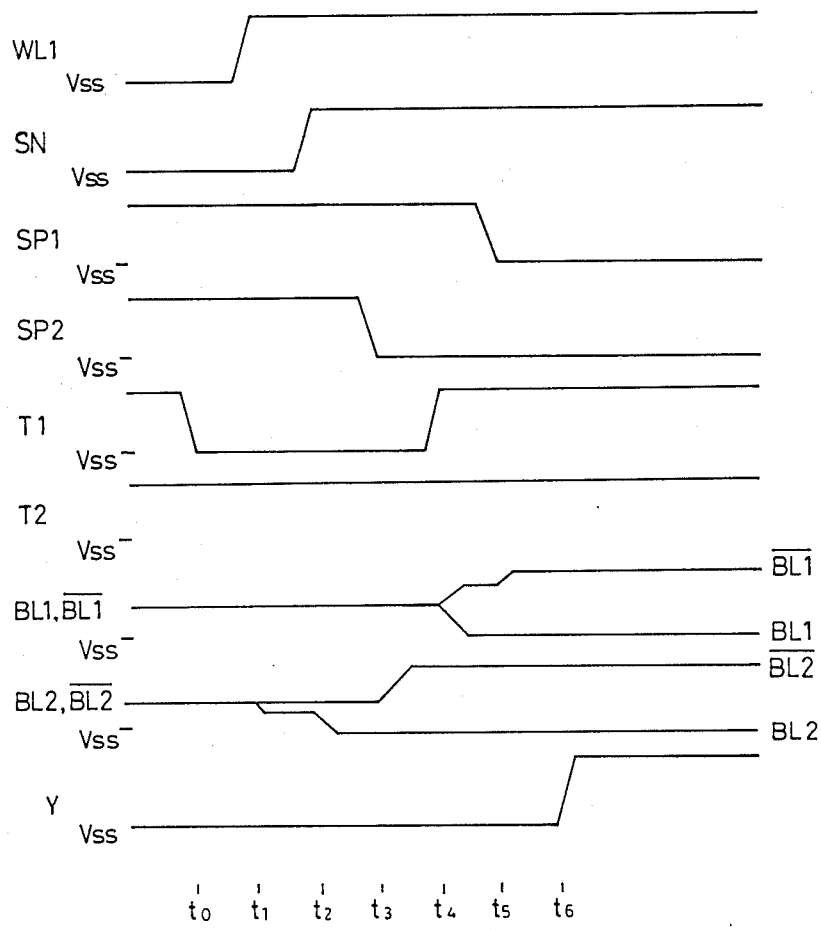
FIG. 2 is a waveform diagram explaining operation of the circuit shown in FIG. 1.
Figure 3:
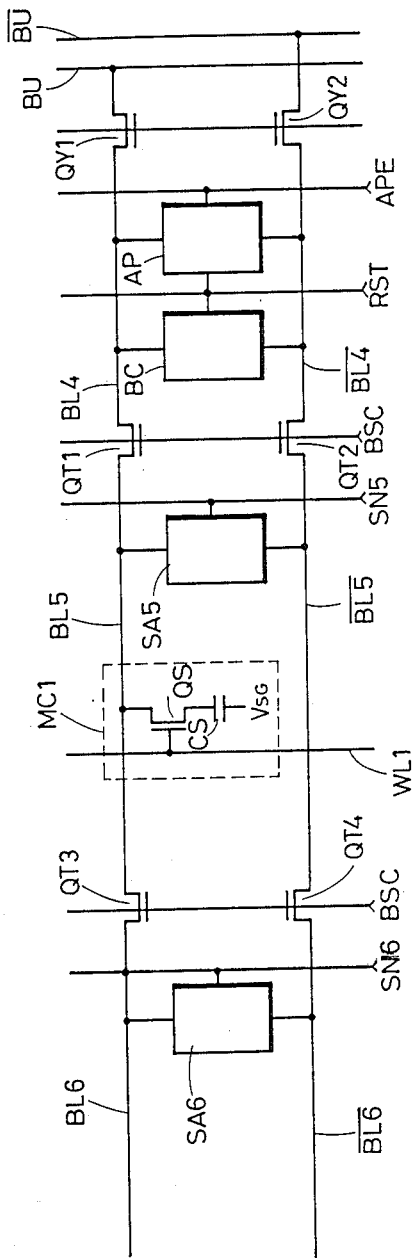
FIG. 3 is a diagram showing a part of a structure of another conventional dynamic RAM.
Figure 4:
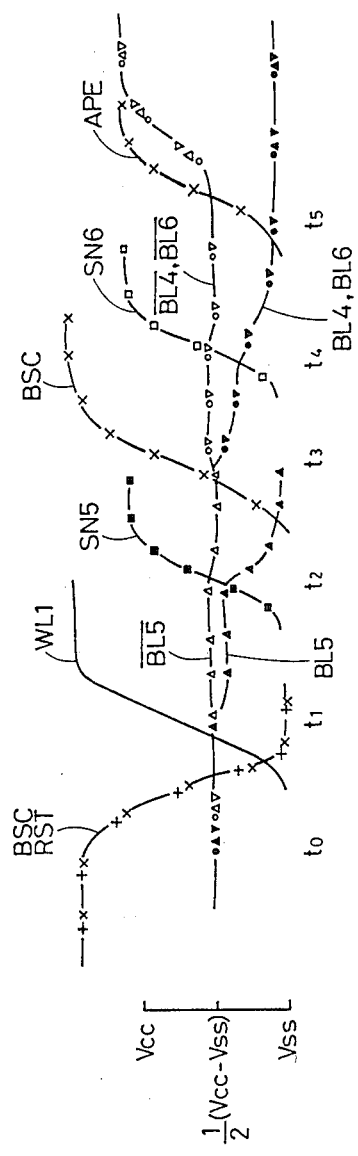
FIG. 4 is a waveform diagram explaining operation of the circuit shown in FIG. 3.

Referring now to the drawings, an embodiment of the present invention is described. However, the description of portions overlapping with that of the prior art is suitably omitted.

Figure 5:
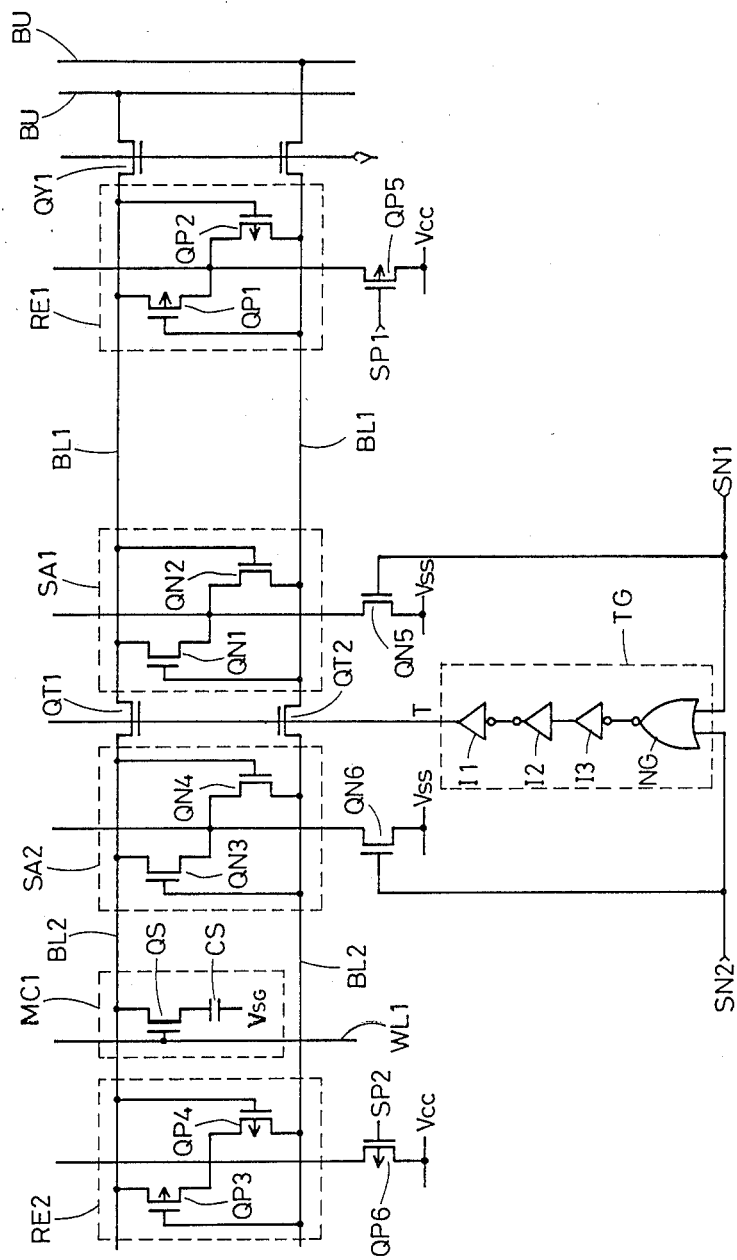
FIG. 5 is a diagram showing main parts of a structure of a dynamic RAM according to an embodiment of the present invention.

FIG. 5 is a circuit diagram showing a structure of a dynamic RAM according to an embodiment of the present invention. The structure of the circuit is now described. For simplicity of illustration, only a pair of folded bit lines out of a plurality pairs of folded bit lines is shown in FIG. 5.

A pair of folded bit lines are divided into the divided bit lines BL1, BL2, $\overline{BL1}$ and $\overline{BL2}$.

The pair of divided bit lines BL1 and $\overline{BL1}$ are connected to a sense amplifier SA1 for discharging the bit line on the side of a low potential so that the potential thereon becomes a ground potential V$_{SS}$, and a restore circuit RE1 for discharging the bit line on the side of a high potential so that the potential thereon becomes a power supply potential V$_{CC}$. The sense amplifier SA1 comprises an n channel MOS transistor QN1 having a drain connected to the divided bit line BL1 and a gate connected to the divided bit line $\overline{BL1}$, and an n channel MOS transistor QN2 having a drain connected to the divided bit line $\overline{BL1}$ and a gate connected to the divided bit line BL1. MOS transistors QN1 and QN2 have sources both connected to one conduction terminal of a sense amplifier driver transistor QN5. The sense amplifier driver transistor QN5 comprises an n channel MOS transistor, and is turned on in response to a sense amplifier activating signal SN1 applied to the gate thereof, so that the sources of the transistors QN1 and QN2 are connected to the ground potential V$_{SS}$. The restore circuit RE1 comprises a p channel MOS transistor QP1 having a drain connected to the divided bit line BL1 and a gate connected to the divided bit line $\overline{BL1}$, and a p channel MOS transistor QP2 having a drain connected to the divided bit line $\overline{BL1}$ and a gate connected to the divided bit line BL1. The transistors QP1 and QP2 have sources both connected to one conduction terminal of a restore circuit driver transistor QP5. The driver transistor QP5 comprises a p channel MOS transistor, and is turned on in response to a restore circuit activating signal SP1 applied to the gate thereof, so that the sources of the transistors QN1 and QN2 are connected to a power supply potential.

The pair of divided bit lines BL2 and $\overline{BL2}$ are connected to a sense amplifier SA2 comprising n channel MOS transistors QN3 and QN4, and a restore circuit RE2 comprising p channel MOS transistors QP3 and QP4. The sense amplifier SA2 is activated by a sense amplifier driver transistor QN6 which is turned on in response to a sense amplifier activating signal. The restore circuit RE2 is activated by a restore circuit driver transistor QP6 which is turned on in response to a restore circuit activating signal SP2.

The divided bit lines BL1 and BL2 and the divided bit lines $\overline{BL1}$ and $\overline{BL2}$ and are connected to each other through transfer gate transistors QT1 and QT2 are turned on in response to a transfer signal T, respectively. The transfer signal T is generated by a transfer signal generator TG in response to an active state of either the sense amplifier activating signal SN1 or SN2. The transfer signal generator TG comprises an NOR gate NG receiving the sense amplifier activating signals SN1 and SN2 and three-stage inverters I1, I2 and I3 receiving an output of the NOR gate NG. The three-stage inverters I1, I2 and I3 provide the delay time required for the transfer signal T to be generated, after transition of either the activating signal SN1 or SN2 to an active state.

The divided bit line BL1 is connected to a bus line BU for transferring data through a column gate transistor QY1 which is an n channel MOS transistor. The divided bit line $\overline{BL1}$ is connected to a bus line $\overline{BU}$ for transferring data through a column gate transistor QY2 which is an n channel MOS transistor. The column gate transistors QY1, QY2 are turned on in response to a column selecting signal Y applied to the gate thereof. Although memory cells are connected to each of the divided bit lines, depending on memory capacity, only a memory cell MC1 connected to the divided bit line BL2 is typically shown herein. The memory cell MC1 comprises a transfer transistor QS and a memory capacitor CS. The transfer transistor QS has a gate being a part of a word line WL1, and the memory capacitor CS has one electrode connected to a memory cell plate potential V$_{SG}$.

Figure 6:
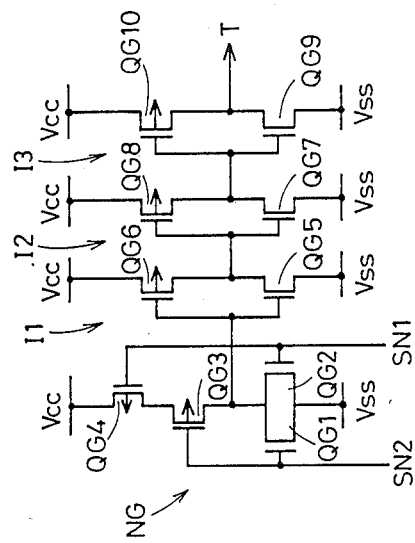
FIG. 6 is a diagram showing a specific structure of a transfer signal generator shown in FIG. 5.

FIG. 6 is a circuit diagram showing an example of a specific structure of the transfer signal generator shown in FIG. 5. The NOR gate NG comprises p channel MOS transistors QG4 and QG3 having gates receiving the sense amplifier activating signals SN1 and SN2, respectively, and n channel MOS transistors QG2 and QG1 having gates receiving the sense amplifier activating signals SN1 and SN2, respectively. The inverter I1 comprises a p channel MOS transistor QG6 and an n channel MOS transistor QG5 connected in a complementary manner. The inverter I2 comprises an n channel MOS transistor QG7 and an n channel MOS transistor QG8 connected in a complementary manner. The inverter I3 comprises an n channel MOS transistor QG9 and a p channel MOS transistor QG10 connected in a complementary manner.

Figure 7A:
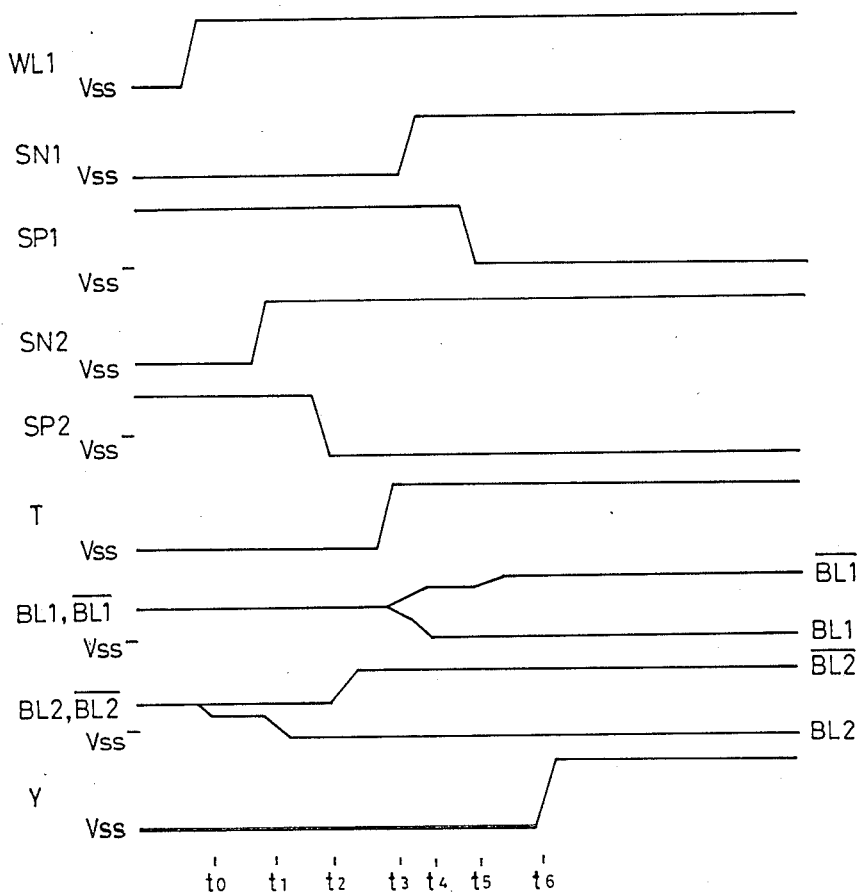
FIGS. 7A and 7B are waveform diagrams of signals explaining operation of the circuit shown in FIG. 5.

FIG. 7A is a waveform diagram for explaining read-out operation when a memory cell stores information "0". Referring now to FIG. 7A which is a waveform diagram for explaining operation, operation showing how information is read out is described when the capacitor CS in the memory cell MC1 is not charged, that is, when information "0" is stored.

Before the time $t_0$, the divided bit lines BL1, $\overline{BL1}$, BL2 and $\overline{BL2}$ are precharged, so the potential thereon becomes an intermediate potential $(V_{CC}-V_{SS})/2$. In addition, the transfer signal T is at an "L" level.

At the time $t_0$, the potential on the selected word line WL1 becomes an "H" level. Accordingly, the transistor QS is turned on. As a result, the potential on the divided bit line BL2 slightly lowers, so that potential difference occurs between the divided bit lines BL2 and $\overline{BL2}$.

At the time $t_1$, the sense amplifier activating signal SN2 becomes an "H" level. Accordingly, the sense amplifier SA2 is activated. As a result, potential difference is increased between the divided bit lines BL2 and $\overline{BL2}$. More specifically, the potential on the divided bit line $\overline{BL2}$ is held near the above described intermediate potential, while the divided bit line BL2 is discharged through the sense amplifier SA2, so that the potential thereon becomes near the ground potential $V_{SS}$.

At the time $t_2$, the restore circuit activating signal SP2 becomes an "L" level. Accordingly, the restore circuit RE2 is activated. As a result, the potential on the divided bit line $\overline{BL2}$ is pulled up near the power supply potential $V_{CC}$ through the restore circuit RE2, so that potential difference is further increased between the divided bit lines BL2 and $\overline{BL2}$.

At the time $t_3$, the transfer signal T becomes an "H" level which was triggered by high going of the sense amplifier activating signal SN2. Thus, the potential on the divided bit lines BL2 and $\overline{BL2}$ are transferred to the divided bit lines BL1 and $\overline{BL1}$ respectively. At that time, the divided bit line BL1 begins to be discharged through the transfer gate transistor QT1 and the sense amplifier SA2, while the potential on the divided bit line $\overline{BL1}$ begins to be pulled up from the above described intermediate potential through the transfer gate transistor QT2 and the restore circuit RE2.

At the time $t_4$, the sense amplifier activating signal SN1 becomes an "H" level. Accordingly, the sense amplifier SA1 operates. As a result, the divided bit line BL1 is discharged, so that the potential thereon becomes near the ground potential $V_{SS}$.

At the time $t_5$, the restore circuit activating signal SP1 becomes an "L" level. Accordingly, the restore circuit RE1 operates. As a result, the potential on the divided bit line BL1 is pulled up near the power supply potential $V_{CC}$.

At the time $t_6$, the column selecting signal Y becomes an "H" level. Accordingly, the column gate transistors QY1 and QY2 are turned on. Thus, the potentials on the divided bit lines BL1 and $\overline{BL1}$ are transferred to the bus lines BU and $\overline{BU}$, so that information "0" stored in the memory cell MC1 is read out.

Figure 7B:
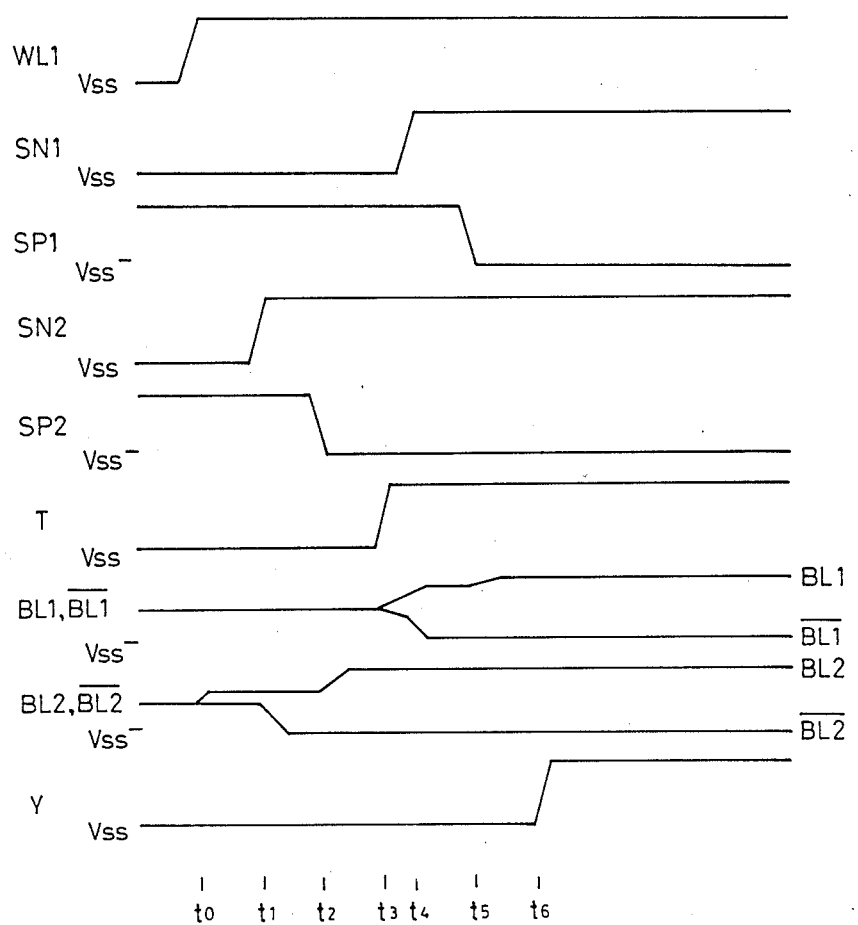

FIG. 7B is a waveform diagram of signals explaining operation for reading out information when information "1" is stored in a memory cell. Referring now to FIG. 7B which is a waveform diagram explaining operation, operation showing how information is read out is described when the capacitor CS in the memory cell MC1 is charged, that is, when information "1" is stored.

Before the time $t_0$, the divided bit lines BL1, $\overline{BL1}$, BL2 and $\overline{BL2}$ are precharged to the intermediate potential, and the transfer signal T becomes an "L" level, as when information "0" is read out.

At the time $t_0$, the selected word line WL1 becomes an "H" level. Accordingly, the MOS transistor QS is turned on. As a result, the potential on the divided bit line BL2 slightly rises, so that potential difference occurs between the divided bit lines BL2 and $\overline{BL2}$.

At the time $t_1$, the sense amplifier activating signal SN2 becomes an "H" level. Accordingly, the sense amplifier SA2 operates. As a result, potential difference is increased between the divided bit lines BL2 and $\overline{BL2}$. More specifically, the potential on the divided bit line BL2 is held to the potential which is a little higher than the above described intermediate potential, while the divided bit line $\overline{BK2}$ is discharged through the sense amplifier SA2, so that the potential thereon becomes near the ground potential $V_{SS}$.

At the time $t_2$, the restore circuit activating signal SP2 becomes an "L" level. As a result, the potential on the divided bit line BL2 is pulled up near the power supply potential $V_{CC}$ through the restore circuit RE2, so that potential difference is further increased between the divided bit lines BL2 and $\overline{BL2}$.

At the time $t_3$, the transfer signal T becomes an "H" level, which was triggered by high going of the sense amplifier activating signal SN2. Thus, the potential on the divided bit lines BL2 and $\overline{BL2}$ are transferred to the divided bit lines BL1 and $\overline{BL1}$, respectively. At that time, the divided bit line $\overline{BL1}$ begins to be discharged through the transfer gate transistor QT2 and the sense amplifier SA2, while the potential on the divided bit line BL1 begins to be pulled up from the above described intermediate potential through the transfer gate transistor QT1 and the restore circuit RE2.

At the time $t_4$, the sense amplifier activating signal SN1 becomes an "H" level. Accordingly, the sense amplifier SA1 operates. As a result, the divided bit line $\overline{BL1}$ is discharged, so that the potential thereon becomes near the ground potential $V_{SS}$.

At the time $t_5$, the restore circuit activating signal SP1 becomes an "L" level. Accordingly, the restore circuit RE1 operates. As a result, the potential on the divided bit line BL1 is pulled up near the power supply potential $V_{CC}$.

At the time $t_6$, the column selecting signal Y becomes an "H" level. Accordingly, the column gate transistors QY1 and QY2 are turned on. Thus, the potentials on the divided bit lines BL1 and $\overline{BL1}$ are transferred to the bus lines BU and $\overline{BU}$, so that information "1" stored in the memory cell MC1 is read out.

As described in the foregoing, information is read out from a memory cell. According to the present invention, the memory cell, for example, the memory cell MC1 is directly connected to the sense amplifier SA2 without through a transfer gate transistor, the bit line BL2 can be formed of only a low resistive material and further decrease in conductance of the transfer gate transistor, caused by narrowing the transistor width when high integration is provided can be avoided. This is true for the other divided bit lines. Therefore, the bit line is discharged in the sense amplifier without through the transfer gate transistor, so that discharge of charges on the bit line and read-out of information in the semiconductor memory are accelerated.

In addition, when information stored in, for example, the memory cell MC1 is read out, the transfer signal T having a delay of a predetermined time is generated in response to the sense amplifier activating signal SN2 of the sense amplifier SA2 which was first operated, so that the transfer gate transistors QT1 and QT2 are turned on. As a result, after potential difference between the divided bit lines BL2 and $\overline{BL2}$ is sufficiently increased by the sense amplifier SA2 and the restore circuit RE2, the increased potential difference is transferred to the divided bit lines BL1 and $\overline{BL1}$. Therefore, sensing operation is stabilized and operating margin of the semiconductor memory is increased.

Furthermore, since restore circuits, such as the restore circuits RE1 and RE2, are provided for each pair of the divided bit lines so that the potential on the bit line on the side of a high potential may be pulled up, an active pull-up circuit having a large area and large drive capacity is not required. In the conventional memory, in order to pull up the potential on an entire bit line of a pair of folded bit lines by a single active pull-up circuit, the gate potential of the transfer gate transistor between the pair of divided bit lines must be boosted over the power supply potential $V_{CC}$, so that reliability of the gate oxide film of the transfer gate transistor was deteriorated. However, according to the present invention, since a restore circuit is provided for each pair of divided bit lines, so that the potentials on the bit lines may pulled up, the gate potential of, for example, the transfer gate transistors QT1 and QT2 need not be boosted over the power supply potential $V_{CC}$, so that reliability of the gate oxide film of the transfer gate transistor is ensured. In addition, the gate potential of the transfer gate transistor need not be boosted over the power supply potential $V_{CC}$, so that speed required for reading out information stored in the semiconductor memory can be increased.

Although in the above described embodiment, a sense amplifier comprises an n channel MOS transistor, and a restore circuit comprises a p channel MOS transistor, the sense amplifier and the restore circuit may comprise a MOS transistor of a conductivity type opposite to the above described conductivity type if polarity of an activating signal is suitably selected, in which case the same effect as the above described embodiment can be obtained.

Furthermore, although in the above described embodiment, a transfer gate transistor and a column gate transistor comprise n channel MOS transistors, the transfer gate transistor and the column gate transistor may comprise p channel MOS transistors if signals applied to the gates of these transistors is suitably selected, in which case the same effect as the above described embodiment can be obtained.

Additionally, although in the above described embodiment, a transistor for a memory cell comprises an n channel MOS transistor, the transistor for the memory cell may comprise a p channel MOS transistor if the potential on a word line is suitably selected, in which case the same effect as the above described embodiment can be obtained.

Although in the above described embodiment, a transfer signal generator comprises an NOR gate and a three-stage inverter, the transfer signal generator may comprise inverters having any number of stages and may comprise the other suitable circuit configuration, in which case the same effect as the above described embodiment can be obtained.

As described in the foregoing, according to the present invention, first switching means for connecting or disconnecting adjacent divided bit lines is provided for each pair of divided bit lines of a pair of a folded bit line, and a sense amplifier and a restore circuit are provided for each pair of divided bit lines. In addition, when information stored in the memory cell in a certain pair of divided bit lines is read out, the first switching means is turned on after a predetermined delay time since the sense amplifier provided for the pair of divided bit lines was operated by control means so that the above described certain pair of divided bit lines and a pair of divided bit lines adjacent thereto may be connected to each other. As a result, sensing operation is accelerated and stabilized, and operating margin of the semiconductor memory is increased. Furthermore, the gate potential of the transfer gate transistor need not be boosted over the power supply potential, so that reliability of a gate oxide film of the transfer gate transistor is improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory comprising:
   a plurality of word lines for selecting a memory cell,
   a plurality of pairs of folded bit lines, each of said pairs of folded bit lines comprising a plurality of pairs of divided bit lines (BL1, $\overline{BL1}$, BL2, $\overline{BL2}$),
   a plurality of memory cells connected between a divided bit line of each of said pairs of divided bit lines and each of said word lines,
   first switching means (QT1, QT2) provided for each of said pairs of divided bit lines for connecting and disconnecting adjacent divided bit lines to each other,
   sense amplifiers (SA1, SA2) provided for each of said pairs of divided bit lines, respectively, each restore circuit comprising a transistor of a first conductivity type for detecting and amplifying the potentials on the divided bit lines,
   restore circuits (RE1, RE2) provided for each of said pairs of divided bit lines, respectively, and comprising a transistor of a second conductivity type for pulling up the potential on the bit line at a high potential,
   delay means responsive to an activating signal of said sense amplifiers for establishing a predetermined delay time, and
   control means (TG) coupled to first switching means and to said delay means and responsive to an activating signal of said sense amplifier provided for the pair of divided bit lines connected to the selected memory cell when information stored in the memory cell selected from said memory cells is read out, for controlling by turning said first switching means on after the predetermined delay time since the sense amplifier was operated, so that said pair of divided bit lines connected to the selected memory cell and a pair of divided bit lines adjacent thereto may be connected to each other.

2. A semiconductor memory in accordance with claim 1, wherein said first switching means (TG) comprises a transfer gate including a transistor.

3. A semiconductor memory in accordance with claim 1, wherein said control means comprises an NOR gate (NG) and said delay means comprises inverters (I1, I2, I3), said control means and delay means turning said first switching means (QT1, QT2) on in response to an activating signal for a sense amplifier which was first operated out of sense amplifiers provided for adjacent pairs of divided bit lines.

4. A semiconductor memory in accordance with claim 1, wherein a pair of divided bit lines (BL1, $\overline{BL1}$)

out of a plurality of pairs of divided bit lines of said pairs of folded bit lines are connected to a pair of bus lines through second switching means (QY1, QY2).

5. A semiconductor memory in accordance with claim 4, wherein said second switching means are turned on after all of said sense amplifiers and said restore circuits provided for each of said pairs of folded bit lines are operated.

6. A semiconductor memory in accordance with claim 4, wherein said second switching means (QY1, QY2) comprise a transfer gate including a transistor.

7. A semiconductor memory comprising:
a plurality of word lines for selecting a memory cell,
a plurality of pairs of folded bit lines, each of said pairs of folded bit lines comprising a plurality of pairs of divided bit lines BL1, $\overline{BL1}$, BL2, $\overline{BL2}$,
a plurality of memory cells connected between a divided bit line of each of said pairs of divided bit lines and each of said word lines,
first switching means (QT1, QT2) provided for each of said pairs of divided bit lines for connecting and disconnecting adjacent divided bit lines to each other,
sense amplifiers (SA1, SA2) provided for each of said pairs of divided bit lines, respectively, and comprising a transistor of a first conductivity type for detecting and amplifying the potentials on the divided bit lines,
restore circuits (RE1, RE2) provided for each of said pairs of divided bit lines, respectively, and comprising a transistor of a second conductivity type for pulling up the potential on the bit line at a high potential, and
control means (TG) responsive to an activating signal of said sense amplifier provided for the pair of divided bit lines connected to the selected memory cell when information stored in the memory cell selected from said memory cells is read out, for controlling by turning said first switching means on after a predetermined delay time since the sense amplifier was operated, so that said pair of divided bit lines connected to the selected memory cell and a pair of divided bit lines adjacent thereto may be connected to each other, wherein said control means comprises an NOR gate (NG) and inverters (I1, I2, I3), and turns said first switching means (QT1, QT2) on in response to an activating signal for a sense amplifier which was first operated out of sense amplifiers provided for adjacent pairs of divided bit lines.

8. A semiconductor memory comprising:
a plurality of word lines for selecting a memory cell,
a plurality of pairs of folded bit lines, each of said pairs of folded bit lines comprising a plurality of pairs of divided bit lines (BL1, $\overline{BL1}$, BL2, $\overline{BL2}$),
a plurality of memory cells connected between a divided bit line of each of said pairs of divided bit lines and each of said word lines,
first switching means (QT1, QT2) provided for each of said pairs of divided bit lines for connecting and disconnecting adjacent divided bit lines to each other,
second switching means wherein a pair of divided bit lines (BL1, $\overline{BL1}$) out of a plurality of pairs of divided bit lines of said pairs of folded bit lines are connected to a pair of bus lines through said second switching means (QY1, QY2),
sense amplifiers (SA1, SA2) provided for each of said pairs of divided bit lines, respectively, and comprising a transistor of a first conductivity type for detecting and amplifying the potentials on the divided bit lines,
restore circuits (RE1, RE2) provided for each of said pairs of divided bit lines, respectively, and comprising a transistor of a second conductivity type for pulling up the potential on the bit line at a high potential, and
control means (TG) responsive to an activating signal of said sense amplifier provided for the pair of divided bit lines connected to the selected memory cell when information stored in the memory cell selected from said memory cells is read out, for controlling by turning said first switching means on after a predetermined delay time since the sense amplifier was operated, so that said pair of divided bit lines connected to the selected memory cell and a pair of divided bit lines adjacent thereto may be connected to each other.

9. A semiconductor memory in accordance with claim 8, wherein said second switching means are turned on after all of said sense amplifiers and said restore circuits provided for each of said pairs of folded bit lines are operated.

10. A semiconductor memory in accordance with claim 8, wherein said second switching means (QY1, QY2) comprise a transfer gate including a transistor.

* * * * *